(12) United States Patent
Parekh et al.

(10) Patent No.: US 12,205,865 B2
(45) Date of Patent: Jan. 21, 2025

(54) SEMICONDUCTOR DEVICE ASSEMBLIES INCLUDING MONOLITHIC SILICON STRUCTURES FOR THERMAL DISSIPATION AND METHODS OF MAKING THE SAME

(71) Applicant: Micron Technology, Inc., Boise, ID (US)

(72) Inventors: Kunal R. Parekh, Boise, ID (US); Angela S. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 331 days.

(21) Appl. No.: 17/720,238

(22) Filed: Apr. 13, 2022

(65) Prior Publication Data

US 2023/0136202 A1     May 4, 2023

Related U.S. Application Data

(60) Provisional application No. 63/274,447, filed on Nov. 1, 2021.

(51) Int. Cl.
*H01L 23/373*     (2006.01)
*H01L 23/00*     (2006.01)
(Continued)

(52) U.S. Cl.
CPC ...... *H01L 23/3738* (2013.01); *H01L 23/3675* (2013.01); *H01L 24/08* (2013.01);
(Continued)

(58) Field of Classification Search
CPC .............. H01L 25/18; H01L 25/0652; H01L 2224/08145; H01L 23/3738;
(Continued)

(56) References Cited

U.S. PATENT DOCUMENTS 10,204,893 B2    2/2019    Uzoh et al.
2008/0157330 A1    7/2008    Kroehnert et al.
(Continued)

FOREIGN PATENT DOCUMENTS

CN     110223971 A     9/2019
CN     110246802 A     9/2019
(Continued)

OTHER PUBLICATIONS

PCT International Application No. PCT/US2022/044030—International Search Report and Written Opinion, dated Jan. 12, 2023, 11 pages.
(Continued)

*Primary Examiner* — Thanh Y. Tran
(74) *Attorney, Agent, or Firm* — Perkins Coie LLP

(57) ABSTRACT

A semiconductor device assembly is provided. The assembly includes a first semiconductor device including a plurality of electrical contacts on an upper surface thereof; a monolithic silicon structure having a lower surface in contact with the upper surface of the first semiconductor device, the monolithic silicon structure including a cavity extending from the lower surface completely through a body of the monolithic silicon structure to a top surface of the monolithic silicon structure; and a second semiconductor device disposed in the cavity, the second semiconductor device including a plurality of interconnects, each operatively coupled to a corresponding one of the plurality of electrical contacts.

20 Claims, 14 Drawing Sheets

(51) Int. Cl.
  *H01L 23/367*     (2006.01)
  *H01L 25/065*     (2023.01)
  *H01L 25/18*      (2023.01)

(52) U.S. Cl.
  CPC .......... *H01L 25/0652* (2013.01); *H01L 25/18* (2013.01); *H01L 2224/08145* (2013.01); *H01L 2225/06582* (2013.01); *H01L 2225/06589* (2013.01); *H01L 2924/1431* (2013.01); *H01L 2924/1434* (2013.01)

(58) Field of Classification Search
  CPC .................. H01L 23/3675; H01L 24/08; H01L 2225/06582; H01L 2225/06589; H01L 2924/1431; H01L 2924/1434; H01L 21/30604; H01L 23/3121; H01L 24/80; H01L 2224/0603; H01L 2224/06051
  See application file for complete search history.

(56) References Cited

U.S. PATENT DOCUMENTS

| | | |
|---|---|---|
| 2011/0215470 A1 | 9/2011 | Chen et al. |
| 2012/0018871 A1 | 1/2012 | Lee et al. |
| 2012/0146209 A1 | 6/2012 | Hu et al. |
| 2013/0292851 A1 | 11/2013 | Pagaila et al. |
| 2015/0311137 A1 | 10/2015 | Oganesian |
| 2016/0005717 A1 | 1/2016 | Lin et al. |
| 2018/0108592 A1 | 4/2018 | Hembree et al. |
| 2018/0366437 A1 | 12/2018 | Chen et al. |
| 2019/0006263 A1 | 1/2019 | Yu et al. |
| 2019/0279883 A1 | 9/2019 | Kim et al. |
| 2020/0051954 A1 | 2/2020 | Kim et al. |
| 2020/0273773 A1 | 8/2020 | Wan et al. |
| 2020/0402877 A1 | 12/2020 | Yu et al. |
| 2021/0288025 A1 | 9/2021 | Arvin et al. |
| 2021/0320058 A1 | 10/2021 | Kang et al. |
| 2023/0139175 A1* | 5/2023 | Parekh .................... H01L 24/80 257/777 |
| 2023/0139914 A1* | 5/2023 | Parekh .................... H01L 25/50 257/777 |

FOREIGN PATENT DOCUMENTS

| | | |
|---|---|---|
| KR | 20200006196 A | 1/2020 |
| KR | 20200070076 A | 6/2020 |
| TW | 201025686 A | 7/2010 |
| TW | 201131715 A | 9/2011 |
| TW | 201207924 A | 2/2012 |
| TW | 201246484 A | 11/2012 |
| TW | 201533814 A | 9/2015 |
| TW | 201906092 A | 2/2019 |
| TW | 202017122 A | 5/2020 |
| TW | 202139373 A | 10/2021 |
| WO | 2011134896 A2 | 11/2011 |

OTHER PUBLICATIONS

PCT International Application No. PCT/US2022/046915—International Search Report and Written Opinion, dated Feb. 20, 2023, 8 pages.
U.S. Appl. No. 17/719,198—Unpublished Patent Application to Kunal R. Parekh et al., filed Apr. 12, 2022, titled "Semiconductor Device Assemblies Including Monolithic Silicon Structures for Thermal Dissipation and Methods of Making the Same", 36 pages.
U.S. Appl. No. 17/719,241—Unpublished Patent Application to Kunal R. Parekh et al., filed Apr. 12, 2022, titled "Semiconductor Device Assemblies Including Monolithic Silicon Structures for Thermal Dissipation and Methods of Making the Same", 37 pages.
ROC (Taiwan) Patent Application No. 111138947—Taiwanese Office Action and Search Report, dated Jun. 2, 2023, with English Translation, 18 pages.
ROC (Taiwan) Patent Application No. 111138947—Taiwanese Office Action, dated Sep. 22, 2023, with English Translation, 14 pages.
EP Patent Application No. 22204906.6—Extended European Search Report, issued Mar. 17, 2023, 13 pages.
TW Patent Application No. 111139239—Taiwanese Office Action and Search Report, dated Jun. 5, 2023, with English Translation, 20 pages.
KR Patent Application No. 10-2022-0138350—Korean Office Action and Search Report, dated Feb. 28, 2024, with English Translation, 17 pages.
KR Patent Application No. 10-2022-0138350—Korean Notice of Allowance Search Report, issued Sep. 25, 2024, 2 pages.

* cited by examiner

US 12,205,865 B2

SEMICONDUCTOR DEVICE ASSEMBLIES INCLUDING MONOLITHIC SILICON STRUCTURES FOR THERMAL DISSIPATION AND METHODS OF MAKING THE SAME

CROSS-REFERENCE TO RELATED APPLICATIONS

The present application claims priority to U.S. Provisional Patent Application No. 63/274,447, filed Nov. 1, 2021, the disclosure of which is incorporated herein by reference in its entirety.

This application contains subject matter related to U.S. Patent Applications by Kunal R. Parekh, filed Nov. 1, 2021, titled "SEMICONDUCTOR DEVICE ASSEMBLIES INCLUDING MONOLITHIC SILICON STRUCTURES FOR THERMAL DISSIPATION AND METHODS OF MAKING THE SAME." The related applications, of which the disclosures are incorporated by reference herein, are assigned to Micron Technology, Inc., and are identified as U.S. Application Nos. 63/274,426 and 63/274,427.

TECHNICAL FIELD

The present disclosure generally relates to semiconductor device assemblies, and more particularly relates to semiconductor device assemblies including monolithic silicon structures for thermal dissipation and methods of making the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Some semiconductor device assemblies include structures configured to assist in the extraction of heat from one or more semiconductor devices in the assembly. These structures are frequently formed from metals with high thermal conductivity, such as copper, silver, aluminum, or alloys thereof. Because the coefficient of thermal expansion (CTE) of these metals may vary greatly from the CTE of the semiconductor devices in the assembly, delamination, cracking, or other types of mechanical damage due to thermal cycling can pose a challenge to these assemblies. Moreover, the fabrication techniques used to form structures from these metals, and to shape them to accommodate additional devices in the assembly, require different tooling than is used for most other assembly processes and can greatly increase the expense of the assemblies in which they are integrated.

To address these drawbacks and others, various embodiments of the present application provide semiconductor device assemblies in which a monolithic silicon structure is provided for thermal dissipation between the surface of a lower die in a multi-die structure and an outer (e.g., upper) surface of the assembly. The monolithic silicon structure can include cavities extending partially or completely therethrough, in which additional semiconductor devices (e.g., dies, die stacks, packages, assemblies, etc.) can be provided. The additional semiconductor devices can be electrically coupled to the same surface of the lower die to which the monolithic silicon structure is attached (e.g., by oxide-oxide bonding, hybrid bonding, adhesive, interconnects, or the like). The monolithic silicon structure, by virtue of its high thermal conductivity and the close match of its coefficient of thermal expansion to that of the lower die, provides improved thermal management without the risks of damage associated with other thermal management structures.

Figure 1:
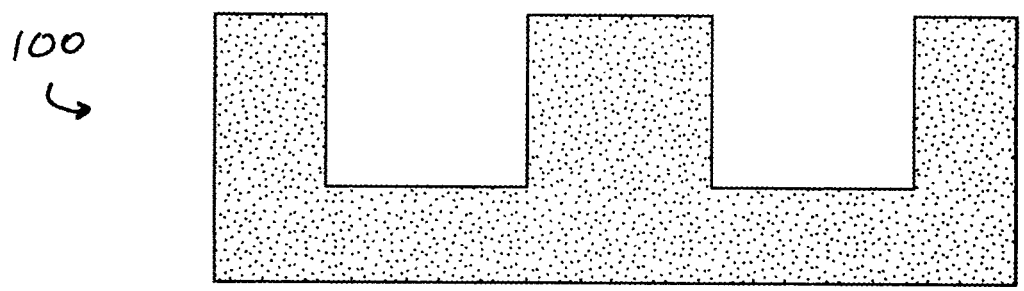
FIG. 1 is a simplified schematic cross-sectional view of a monolithic silicon structure for thermal dissipation in accordance with one embodiment of the present disclosure.

FIG. 1 is a simplified schematic partial cross-sectional view of a monolithic silicon structure 100 in accordance with an embodiment of the present disclosure. Monolithic silicon structure 100 includes one or more cavities (two are illustrated) extending at least part way through the thickness (e.g., into the body) of the monolithic silicon structure 100. The structure 100 can be formed, e.g., from a blank silicon wafer, in which cavities have been formed (e.g., by masking and directionally etching, laser ablating, etc.). The structure 100 can be kept at a wafer-level for subsequent wafer-level processing steps, or can optionally be singulated prior to subsequent processing steps.

Figure 2:
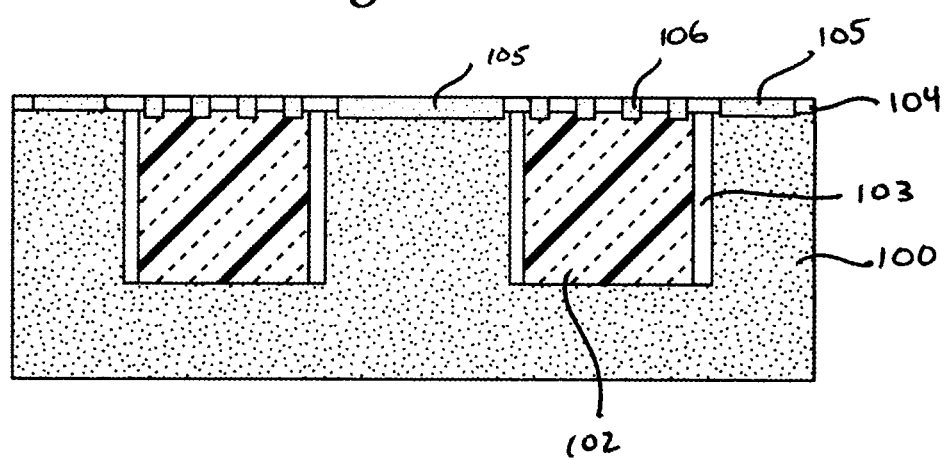
FIGS. 2 through 10 are simplified schematic cross-sectional views of semiconductor device assemblies at various stages in a process of fabrication in accordance with embodiments of the present disclosure.

In accordance with one aspect of the present disclosure, monolithic silicon structure 100 can be pre-populated with semiconductor devices in the cavities thereof prior to integration into a larger semiconductor device assembly. FIG. 2 is a simplified schematic cross-sectional view of a monolithic silicon structure 100 in which several semiconductor devices have been disposed in accordance with one embodiment of the present disclosure. As can be seen with reference to FIG. 2, semiconductor devices 102 (e.g., individual dies, vertical stacks of interconnected dice, device packages, device assemblies, etc.) have been disposed into the cavities of monolithic silicon structure 100. Each semiconductor device 102 may be secured in the corresponding cavities by an adhesive (e.g., a thermal interface material) between the back surface of the semiconductor device and the facing interior surface of the cavity. The cavities may be sized such that small gaps 103 (e.g., optionally filled with an adhesive, an underfill, an encapsulant, or the like) remain surrounding the semiconductor devices 102 to ease the process of disposing them in the cavities. In other embodiments, gaps 103 may be minimized or even eliminated through careful matching of the exterior dimensions of the semiconductor devices 102 and the cavities. To facilitate the integration of the semiconductor devices 102 and the monolithic silicon structure 100 into a larger assembly, a redistribution layer 104, including one or more thermal pads 105 (e.g., comprising copper, silver, aluminum, or other metals compatible with a metal-metal bonding operation) aligned with the monolithic silicon structure 100 and one or more interconnects 106 (e.g., pads, pillars, UBMs, pins, solder balls, etc.) operatively coupled to the semiconductor devices 102 can be formed. In other embodiments, the redistribution layer can be omitted and semiconductor devices 102 can be provided with interconnects prior to population into the monolithic silicon structure 100 (e.g., coplanar with the bonding surface of the monolithic silicon structure 100).

Figure 3:
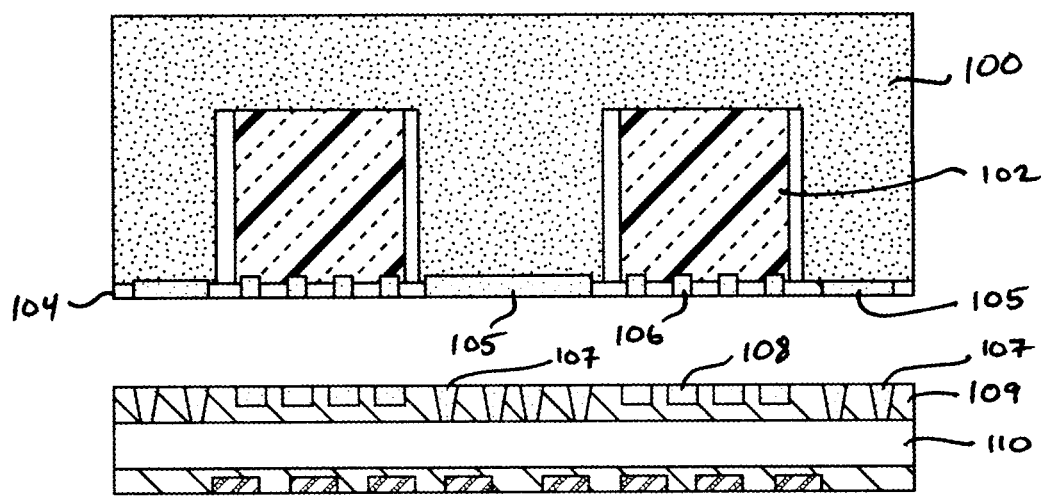
Figure 4:
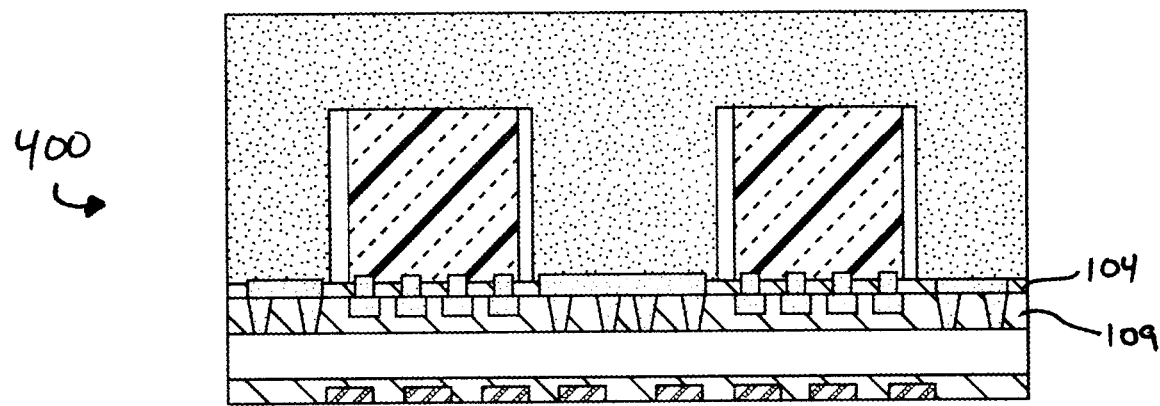

Turning to FIG. 3, the populated monolithic silicon structure 100 is illustrated being aligned in preparation for bonding to another semiconductor device (e.g., the aforementioned lower semiconductor device in the assembly), in accordance with one embodiment of the present disclosure. The lower semiconductor device 110 includes a dielectric layer 109 in which are disposed electrical contacts 107 and thermal contacts 108. The populated monolithic silicon structure 100 can be bonded to the lower semiconductor device 110 such that the thermal pads 105 are coupled to the thermal contacts 107 and the interconnects 106 are coupled to the electrical contacts 108 to form semiconductor device assembly 400, as illustrated in accordance with one embodiment of the disclosure in FIG. 4. The bonding operation can be a hybrid bonding operation, in which a dielectric-dielectric bond (e.g., an oxide-oxide bond) is formed between the dielectric of redistribution layer 104 and the dielectric layer 109 formed over the lower semiconductor device 110 and metal-metal bonds are formed between corresponding ones of the thermal pads 105 and the thermal contacts 107, and between corresponding ones of the interconnects 106 and the electrical contacts 108.

Although in the foregoing example embodiments semiconductor device assembly 400 has been illustrated as formed through a hybrid bonding operation, in other embodiments the bond between a populated monolithic silicon structure and a lower semiconductor device can be achieved with adhesive layers (e.g., thermal interface material (TIM)), solder interconnects with or without underfill, or any other bonding method well known to those skilled in the art.

In accordance with an additional aspect of the present disclosure, semiconductor device assembly 400 can optionally be subject to further processing to remove the portions of the monolithic silicon structure 100 overlying the cavities in which semiconductor devices 102 have been disposed, in order to reduce a height of the assembly and/or to provide additional connectivity options. In this regard, FIG. 5 is a simplified schematic cross-sectional view of a semiconductor device assembly 500, in which an assembly like that illustrated in FIG. 4 has been subjected to a backside thinning operation (e.g., by chemical-mechanical polishing (CMP), grinding, etc.) to remove portions of material from the monolithic silicon structure 100 in order to expose the back surfaces of semiconductor devices 102 and to reduce the overall height of the assembly 500.

In an embodiment in which semiconductor devices 102 include backside contacts for further connectivity, removing the portions of material from the monolithic silicon structure 100 covering the back surfaces of semiconductor devices 102 can permit additional devices to be integrated into the semiconductor device assembly. One such arrangement is shown in FIG. 6, in which is illustrated a simplified schematic cross-sectional view of a semiconductor device assembly 600. As can be seen with reference to FIG. 6, an assembly like that illustrated in FIG. 5 has had additional semiconductor devices 111 (e.g., individual dies, vertical stacks of interconnected dice, device packages, device assemblies, etc.) connected to the exposed backside contacts of semiconductor devices 102 (e.g., through traditional flip-chip interconnections, solder ball arrays, hybrid bonding, etc.). The additional semiconductor devices 111 can then be encapsulated by a layer of mold material 112 to provide mechanical protection thereto.

Figure 5:
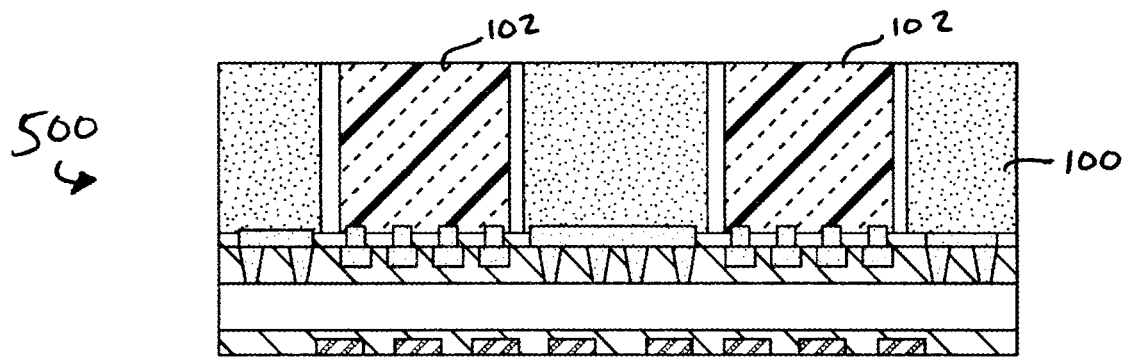
Figure 6:
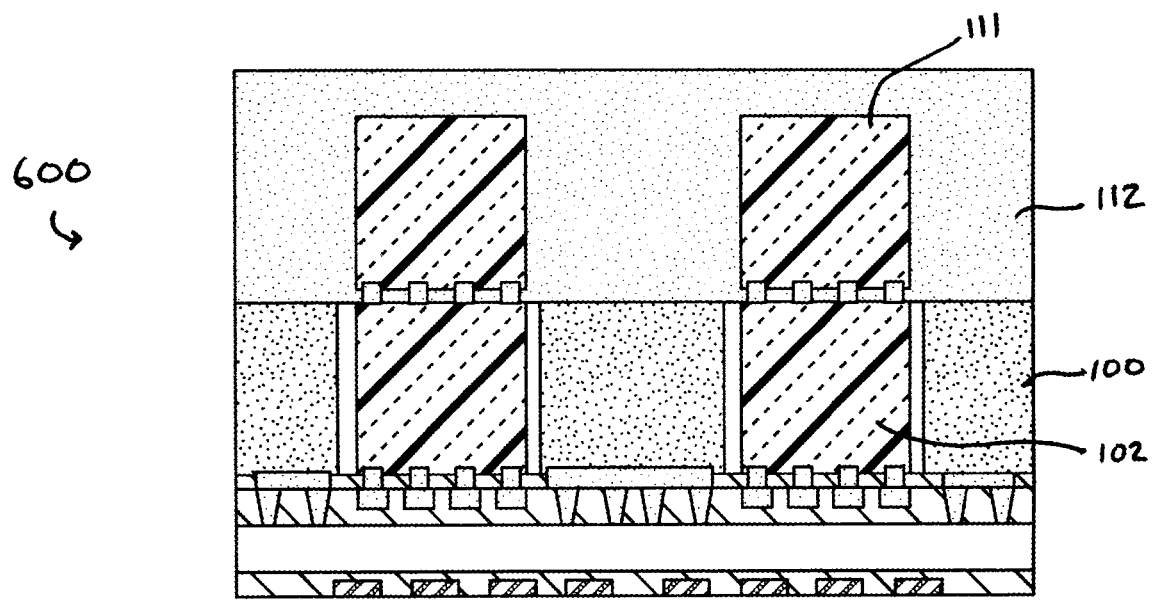

Alternatively, rather than individually connecting additional semiconductor devices to the exposed backside contacts of semiconductor devices 102, as illustrated in FIG. 6, in another embodiment one or more additional pre-populated monolithic silicon structures (e.g., like that illustrated in FIG. 2) can be bonded to the semiconductor assembly 500 illustrated in FIG. 5 to provide an assembly with a high density of devices while retaining good thermal performance. One such assembly is shown in FIG. 7, in which is illustrated a simplified schematic cross-sectional view of a semiconductor device assembly 700, in which an assembly like that illustrated in FIG. 5 has had an additional monolithic silicon structure 113 populated with semiconductor devices bonded to thereto.

Figure 7:
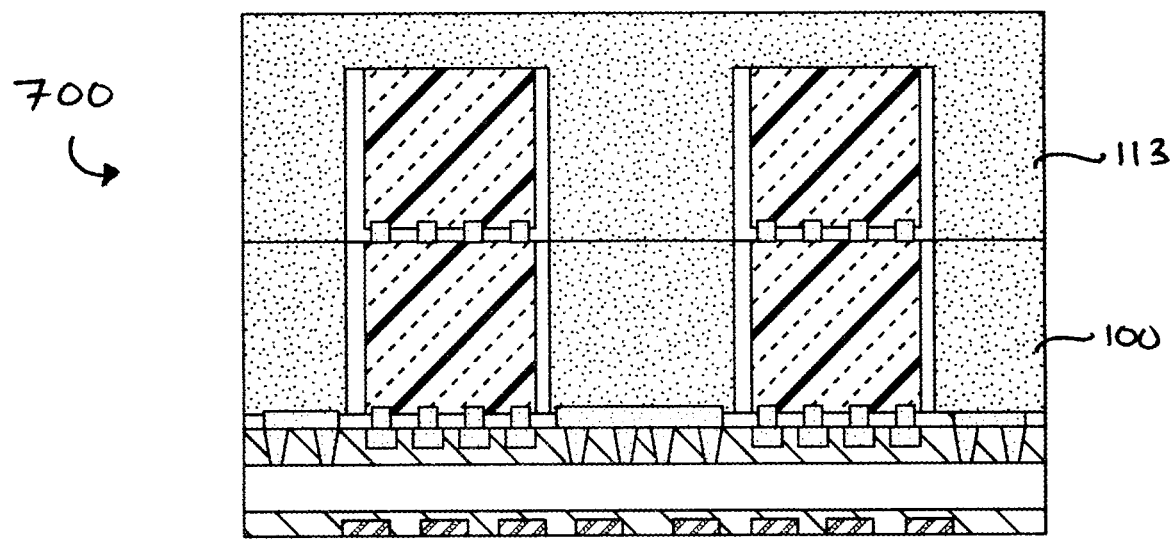

As one of skill in the art will readily appreciate, the processes illustrated in FIGS. 5 and 7 can be iteratively repeated, such that an additional populated monolithic silicon structure can itself be subjected to another backside thinning operation to expose the backside contacts of the semiconductor devices therein for bonding to yet another populated monolithic silicon structure, in accordance with one aspect of the present disclosure.

Alternatively or additionally, rather than a backside thinning operation which completely removes the material of a monolithic silicon structure covering the back surfaces of the semiconductor devices populated in cavities thereof, in another embodiment the material of a monolithic silicon structure covering the back surfaces of the semiconductor devices populated in cavities thereof can merely be thinned sufficiently to permit the formation of vias (e.g., through-silicon vias (TSVs)) through the thinned material to connect to the backside contacts of the semiconductor devices. This may be more readily understood with reference to FIG. 8, in which is shown an assembly like that of FIG. 4 that has been subjected to a backside thinning operation which removed a portion of the material covering the back surfaces of the semiconductor devices in the cavities, and has been further subjected to a TSV formation operation (e.g., forming openings through the silicon material, passivating the openings, removing the passivation from the bottom of the openings to expose backside contacts, plating a conductor into the openings, etc.) providing TSVs 114 extending through the thinned material to contact backside contacts of the semiconductor devices to facilitate further connectivity.

Figure 8:
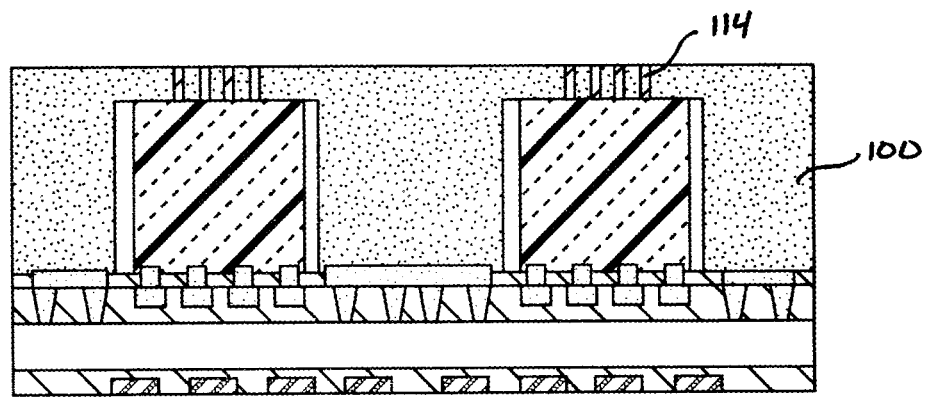
Figure 9:
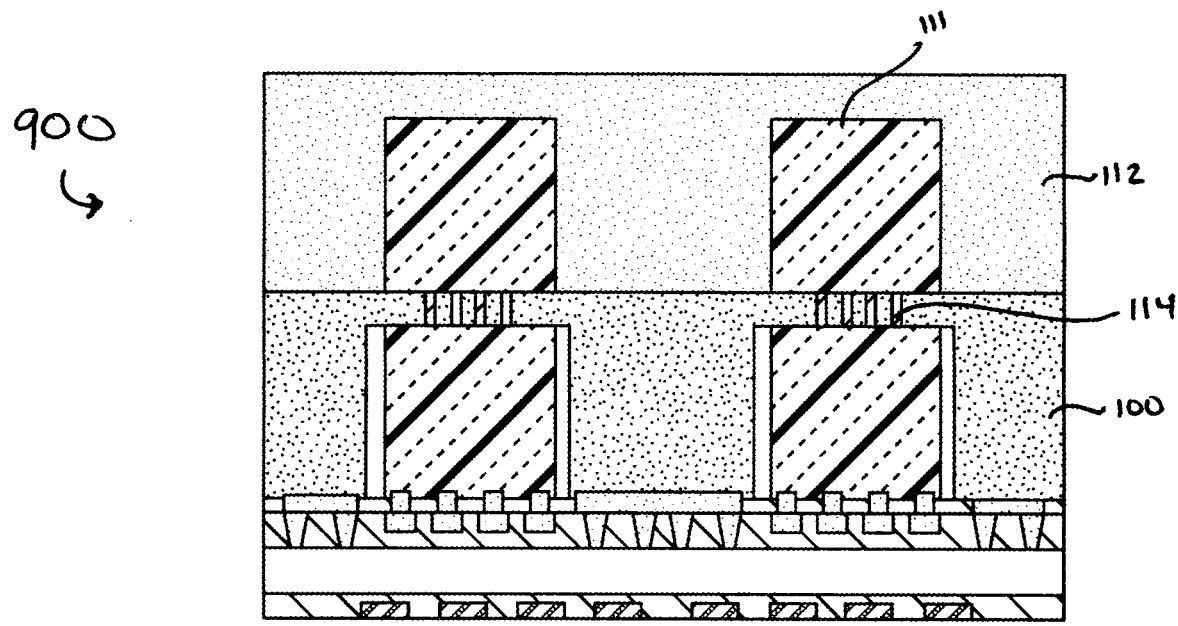

Turning to FIG. 9, a simplified schematic cross-sectional view of a semiconductor device assembly 900 is illustrated, in which an assembly like that shown in FIG. 8 has had additional semiconductor devices 111 (e.g., individual dies, vertical stacks of interconnected dice, device packages, device assemblies, etc.) connected to the TSVs 114 extending through the monolithic silicon structure 100 to semiconductor devices 102 (e.g., through traditional flip-chip interconnections, solder ball arrays, hybrid bonding, etc.). The additional semiconductor devices 111 can then be encapsulated by a layer of mold material 112 to provide mechanical protection thereto, as described in greater detail above with reference to FIG. 6.

Figure 10:
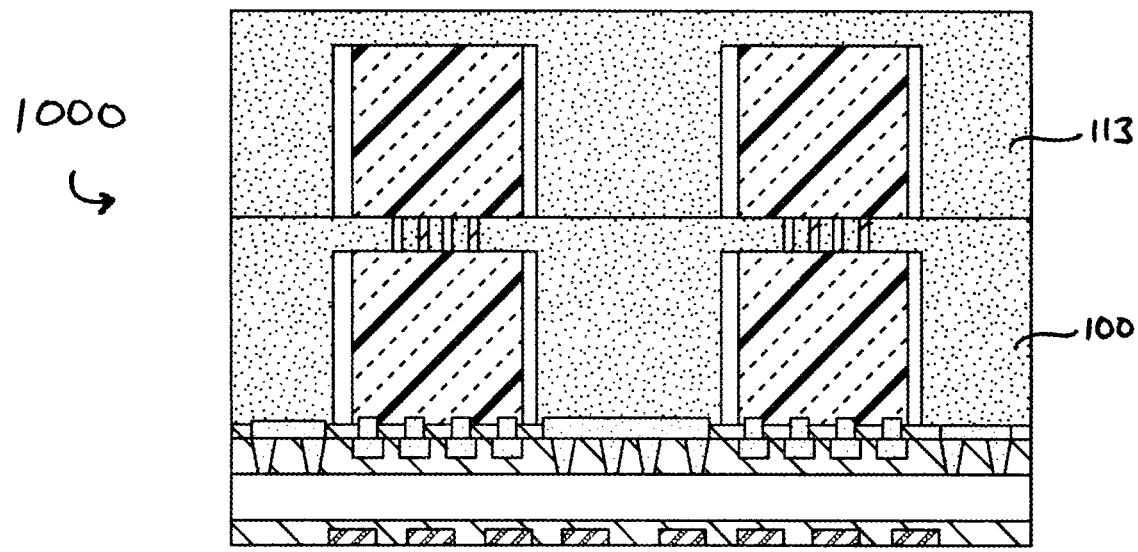

Alternatively, rather than individually connecting additional semiconductor devices to the TSVs 114 as illustrated in FIG. 9, in another embodiment one or more additional pre-populated monolithic silicon structures (e.g., like that illustrated in FIG. 2) can be bonded to the semiconductor assembly illustrated in FIG. 8 to provide an assembly with a high density of devices while retaining good thermal performance. One such assembly 1000 is shown in FIG. 10, in which is illustrated a simplified schematic cross-sectional view of a semiconductor device assembly 100, in which an assembly like that illustrated in FIG. 8 has had an additional monolithic silicon structure 113 populated with semiconductor devices bonded to thereto.

As set forth above, a monolithic silicon structure can be fabricated from a blank silicon wafer via traditional etching techniques for forming openings or cavities in silicon. Alternatively or additionally, methods for fabricating monolithic silicon structures can include highly-controllable and high-speed etching processes as set forth in greater detail below, in accordance with various embodiments of the present disclosure.

Figure 11:
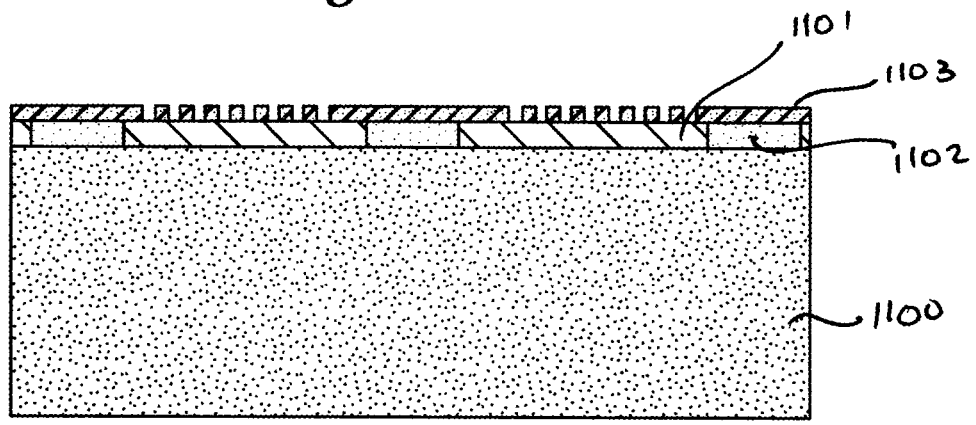
FIGS. 11 through 14 are simplified schematic cross-sectional views of monolithic silicon structures for thermal dissipation at various stages in a process of fabrication in accordance with embodiments of the present disclosure.
Figure 12:
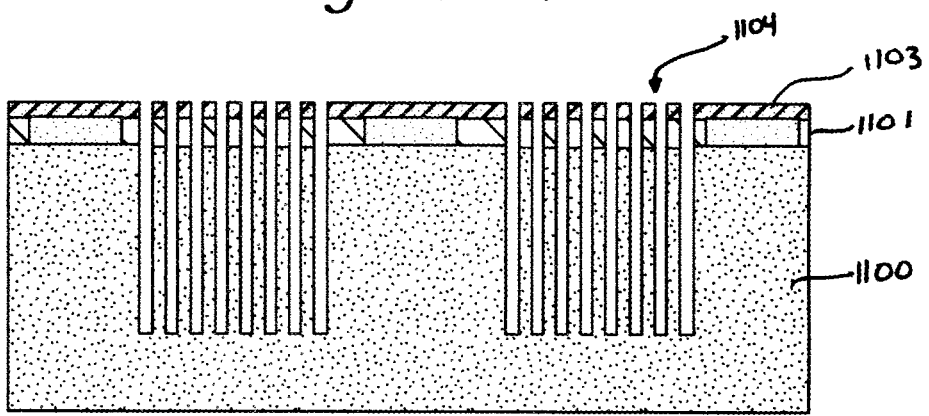
Figure 13:
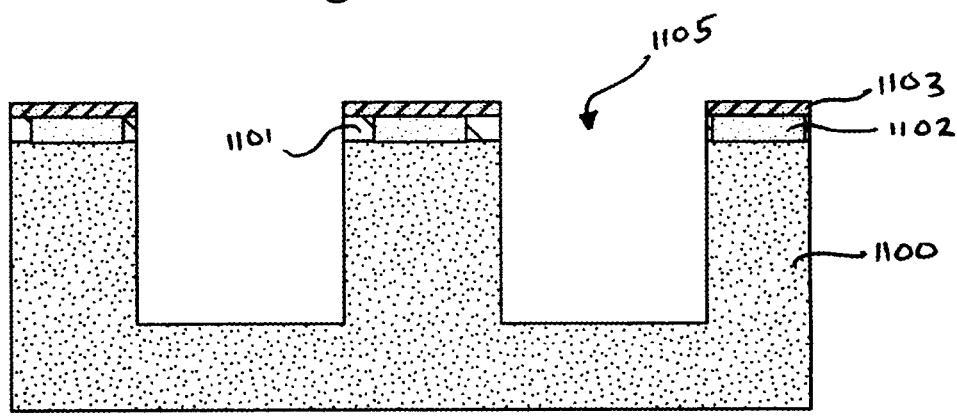

Turning to FIG. 11, a precursor structure from which a monolithic silicon structure will be formed is shown in a simplified partial cross-sectional view at a step in the formation process in accordance with one embodiment of the present disclosure. The precursor structure includes a silicon wafer 1100 on which has been formed passivation layer 1101 (e.g., a dielectric material) in which are formed one or more thermal pads 1102. A mask layer 1103 is formed over the passivation layer 1101, with a pattern corresponding to the cavities to be formed in the silicon wafer 1100. More particularly, the mask layer 1103 includes a pattern of small openings (e.g., corresponding to narrow columnar or fin-like structures) that overlie a region in the silicon wafer 1100 where the cavities are to be formed. As can be seen with reference to FIG. 12, the small openings 1104 can be etched at least partially into a thickness of the silicon wafer 1100 to remove some of the material from where the cavities are to be formed. An advantage of etching a smaller amount of material from the cavity, rather than the entire cavity, is that the directional etching operation can be completed more quickly than if the mask opening corresponded to the full size of the eventual cavity opening. Having anisotropically etched these "slivers" of material out of the silicon wafer 1100, a subsequent isotropic (e.g., wet) etch operation can be performed to remove the remaining material from the silicon wafer 1100 where the cavities are to be formed. The result of such an operation is illustrated in FIG. 13, which shows cavities 1105 having been formed by this two-step anisotropic and isotropic etching process in accordance with one embodiment of the present disclosure. After removing the remains of mask layer 1103 (e.g., via a chemical and/or mechanical removal process), as shown in FIG. 14, monolithic silicon structure 1400, with included thermal pads 1102 and cavities 1105, is ready for the processes previously described in greater detail above with reference to FIGS. 2 through 10.

As an alternative to pre-populating a monolithic silicon structure like those of FIG. 1 or 14 with semiconductor devices before attaching the monolithic silicon structure to a lower semiconductor device in an assembly, some embodiments of the disclosure can involve attaching a monolithic silicon structure to a semiconductor device, backside thinning the monolithic silicon structure to reveal the cavities therein, and subsequently disposing semiconductor devices inside the cavities. One such approach to forming a semiconductor device assembly is shown at various stages in the process in FIGS. 15 to 20, according to various embodiments of the present disclosure.

Figure 14:
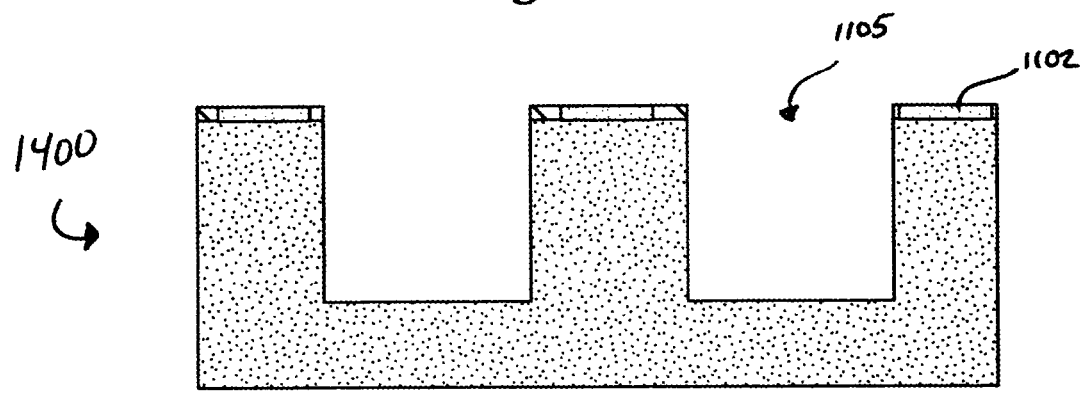
Figure 15:
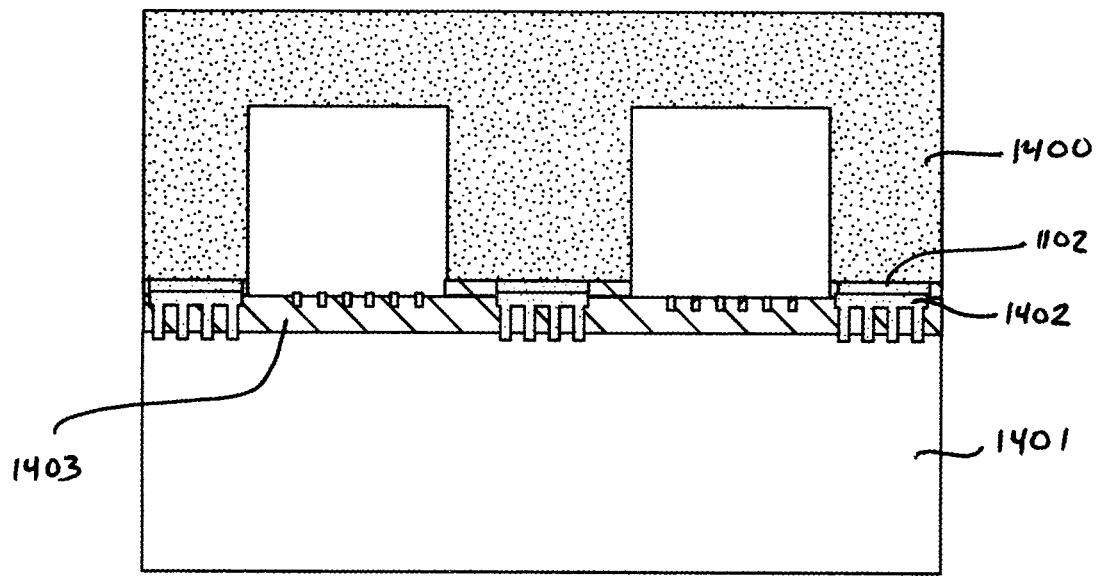
FIGS. 15 through 20 are simplified schematic cross-sectional views of semiconductor device assemblies at various stages in a process of fabrication in accordance with embodiments of the present disclosure.

Turning to FIG. 15, the monolithic silicon structure 1400 of FIG. 14 is shown after having been bonded to a lower semiconductor device 1401 in accordance with one aspect of the disclosure. In this regard, monolithic silicon structure 1400 is bonded to the lower semiconductor device 1401 such that the thermal pads 1102 are coupled to thermal contacts 1402 of the lower semiconductor device 1401. The bonding operation can be a hybrid bonding operation, in which a dielectric-dielectric bond (e.g., an oxide-oxide bond) is formed between the dielectric 1101 of the monolithic silicon structure and a dielectric layer 1403 formed over the lower semiconductor device 1401 and metal-metal bonds are formed between corresponding ones of the thermal pads 1102 and the thermal contacts 1402.

Figure 16:
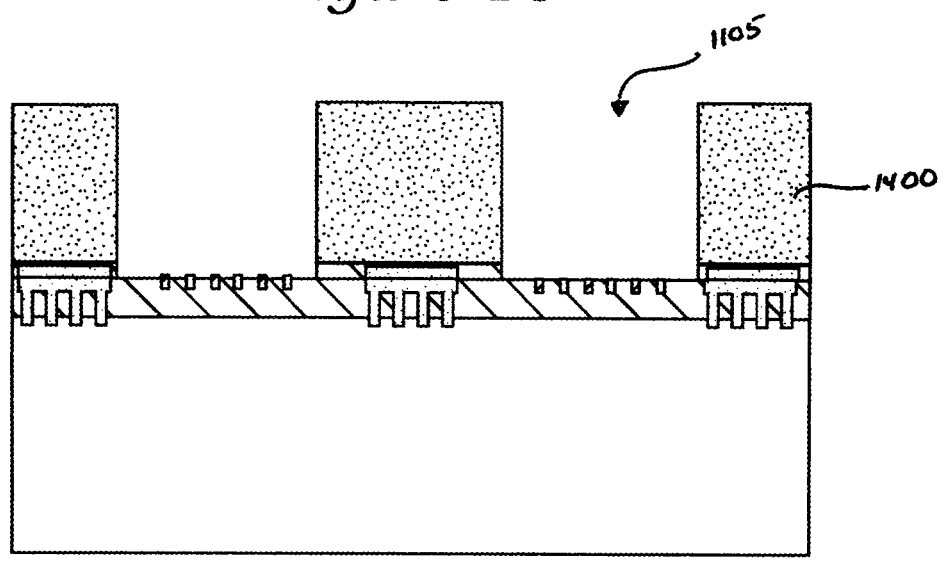
Figure 17:
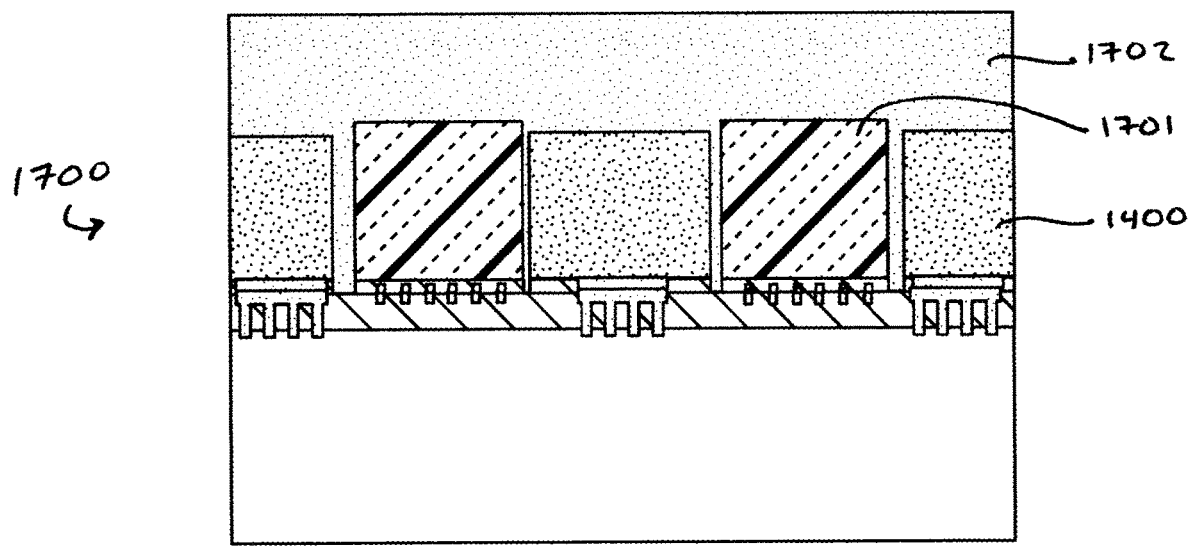

The monolithic silicon structure 1400 can, after bonding to the lower semiconductor device 1401, be subjected to a backside thinning operation (e.g., by chemical-mechanical polishing (CMP), grinding, etc.) to remove portions of material from the monolithic silicon structure 1400 in order to expose the cavities 1105, as illustrated in FIG. 16. With the cavities 1105 thus opened, semiconductor devices (e.g., individual dies, vertical stacks of interconnected dice, device packages, device assemblies, etc.) 1701 can be disposed in the cavities 1105, and an encapsulant (e.g., mold material) 1702 can be disposed over (and optionally around, depending upon the relative sizes of the semiconductor devices 1701 and cavities 1105) the semiconductor devices 1701, to produce semiconductor device assembly 1700, as shown in FIG. 17. Subsequent processing steps (e.g., singulating the assembly 1700 from wafer- or panel-level, thinning and providing external connections to the lower semiconductor device 1401, etc.) can be performed at this point (and are not illustrated to preserve the clarity of the disclosure).

Figure 18:
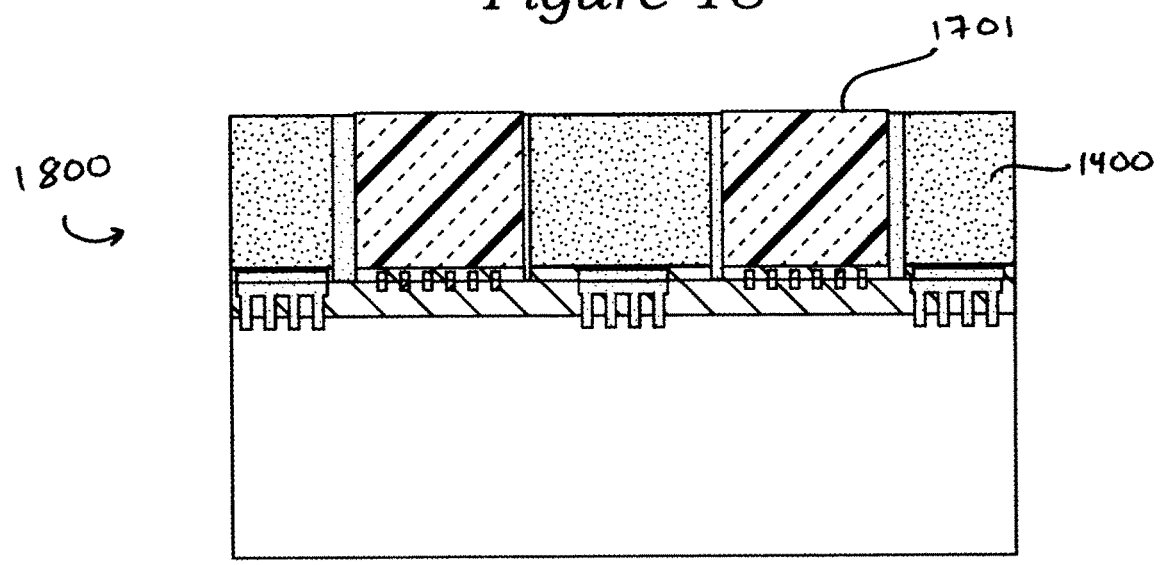

Alternatively, the semiconductor device assembly 1700 can be subjected to additional processing operations to remove the overlying portions of the encapsulant material 1702 and expose the back surfaces of the semiconductor devices 1701, analogously to the processes described above with reference to FIGS. 4 and 5, in order to thin the assembly 1700 and/or prepare the assembly for additional connectivity. In this regard, FIG. 18 is a simplified schematic cross-sectional view of a semiconductor device assembly 1800, in which an assembly like that illustrated in FIG. 17 has been subjected to a backside thinning operation (e.g., by chemical-mechanical polishing (CMP), grinding, etc.) to remove overlying portions of the encapsulant 1702 in order to expose (and optionally to planarize) the back surfaces of semiconductor devices 1701 and to reduce the overall height of the assembly 1800.

In an embodiment in which semiconductor devices 1701 include backside contacts for further connectivity, removing the portions of material from the encapsulant 1702 covering the back surfaces of semiconductor devices 1701 can permit additional devices to be integrated into the semiconductor device assembly, as described in greater detail above with respect to FIGS. 6 and 7. In this regard, additional semiconductor devices can be directly attached to the exposed backside contacts of semiconductor devices 1701 and then encapsulated by a layer of mold material (e.g., analogously to the arrangement illustrated in FIG. 6). Alternatively, rather than individually connecting additional semiconductor devices to the exposed backside contacts of semiconductor devices 1701, in another embodiment one or more additional pre-populated monolithic silicon structures (e.g., like that illustrated in FIG. 2) can be bonded to the semiconductor assembly 1800 illustrated in FIG. 18 to provide an assembly with a high density of devices while retaining good thermal performance. In yet another embodiment, the processes illustrated in FIGS. 15 through 18 can be iteratively performed on the assembly 1800 of FIG. 18 (e.g., disposing another monolithic silicon structure 1400 over the assembly 1800, thinning the monolithic silicon structure 1400 to open the cavities 1105 therein, disposing additional semiconductor devices in the exposed cavities, encapsulating with a mold material, and optionally thinning the overlying mold material), to provide an assembly with a high density of devices while retaining good thermal performance. As one of skill in the art will readily appreciate, the foregoing processes can be mixed, matched, and iteratively repeated, such that additional tiers of semiconductor devices can be provided until a desired device density has been achieved.

Figure 19:
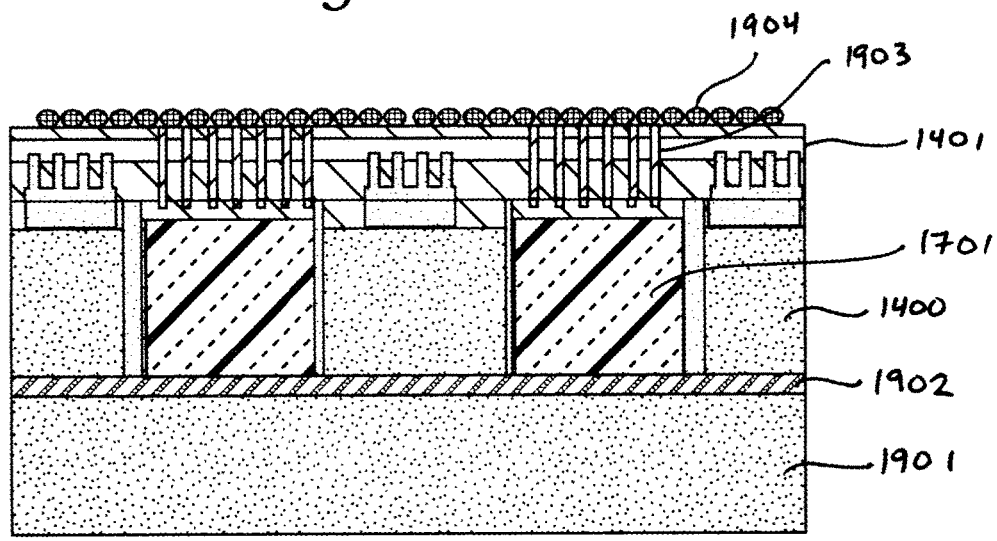
Figure 20:
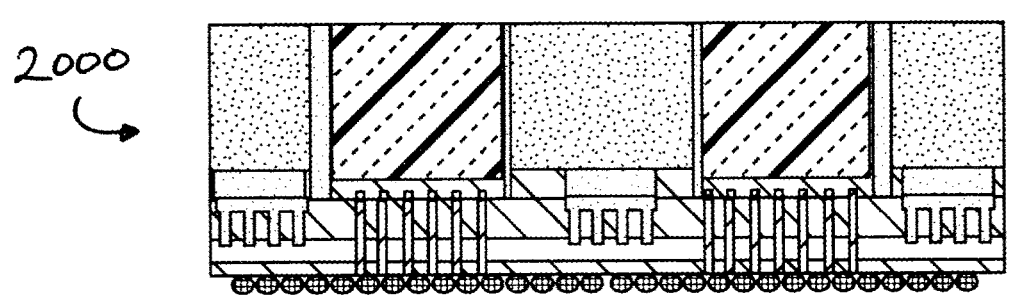

Semiconductor device assembly has been illustrated as being formed over a lower semiconductor device 1401 which has yet to be thinned or provided with backside contacts (e.g., on a lower surface thereof in the illustrated orientation). FIG. 19 illustrates a process by which the lower semiconductor device 1401 can be thinned and provided with TSVs and backside contacts in accordance with one aspect of the present disclosure. As can be seen with reference to FIG. 19 semiconductor device assembly 1800 has been bonded to a temporary carrier wafer 1901 by a layer of adhesive 1902 disposed over the monolithic silicon structure 1400 and the exposed back surfaces of semiconductor devices 1701. While supported mechanically by the carrier wafer 1901, the back surface of lower semiconductor device 1401 can be thinned (e.g., by CMP, grinding, etc.) to reduce a total height of the assembly and to permit the formation of TSVs 1903 through a remaining thickness of lower semiconductor device 1401. Backside contacts (e.g., pads, pillars, under-bump metallization (UBM), etc.) can be formed, such as those carrying solder ball array 1904, using any one of a number of methods known to those of skill in the art. In another embodiment, rather than forming vias 1903 after thinning the lower semiconductor device 1401, buried TSVs already formed in lower semiconductor device 1401 at an earlier stage of processing may merely be exposed by the thinning operation illustrated in FIG. 19. Once the thinning and contact formation is complete, temporary carrier wafer 1901 and adhesive 1902 can be removed, resulting in completed semiconductor device assembly 2000, as illustrated in FIG. 20.

Although the silicon material of the foregoing monolithic silicon structures enjoys a high thermal conductivity, it can be advantageous in some circumstances to include copper, silver, aluminum, or other highly thermally conductive metals in some regions of a monolithic silicon structure to further enhance the heat management capabilities thereof while minimizing the difference in CTE between the structure and the semiconductor devices in the assembly. In this regard, FIGS. 21 through 26 illustrate the fabrication and integration of one embodiment of a monolithic silicon structure which includes metallic heat extraction structures.

Figure 21:
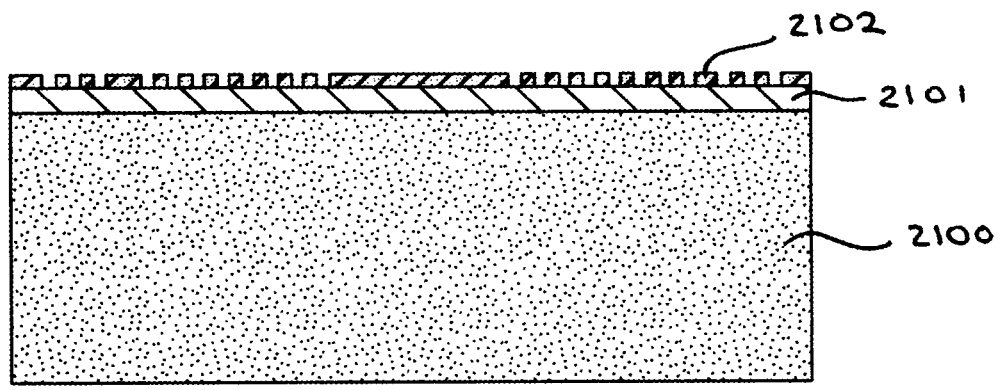
FIGS. 21 through 25 are simplified schematic cross-sectional views of monolithic silicon structures for thermal dissipation at various stages in a process of fabrication in accordance with embodiments of the present disclosure.

Turning to FIG. 21, a precursor structure from which a monolithic silicon structure will be formed is shown in a simplified partial cross-sectional view at a step in the formation process in accordance with one embodiment of the present disclosure. The precursor structure includes a silicon wafer 2100 on which has been formed passivation layer 2101 (e.g., a dielectric material) in which can optionally be formed one or more thermal pads (not illustrated). A mask layer 2102 is formed over the passivation layer 2101, with a pattern corresponding both to the cavities and the metallic heat extraction structures to be formed in the silicon wafer 2100. More particularly, the mask layer 2102 includes a pattern of small openings (e.g., corresponding to narrow columnar or fin-like structures) that overlie both regions in the silicon wafer 2100 where the cavities are to be formed and regions in the silicon wafer 2100 where the metallic heat extraction structures are to be formed.

Figure 22:
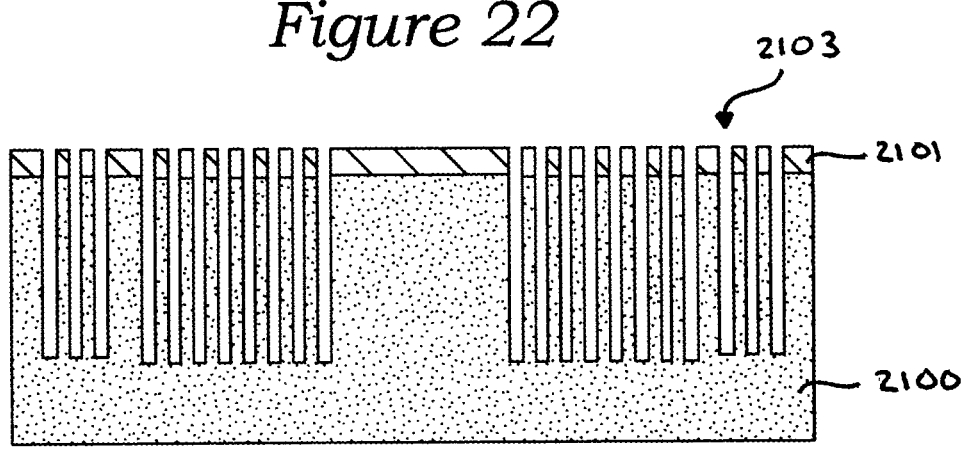
Figure 23:
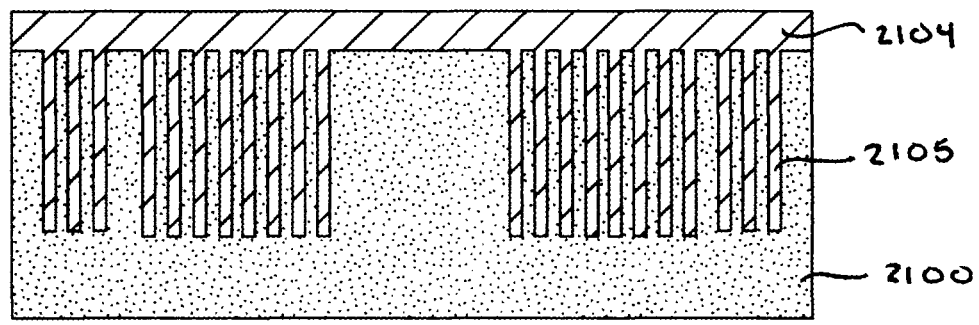
Figure 24:
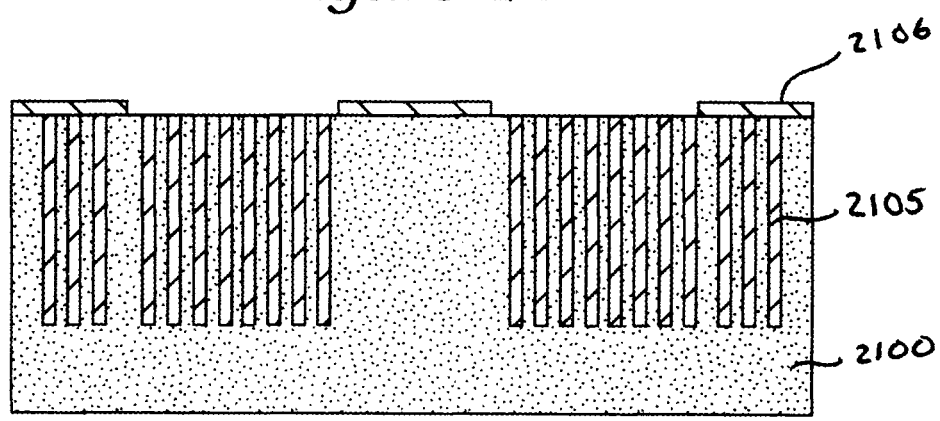

As can be seen with reference to FIG. 22, the small openings 2103 can be etched at least partially into a thickness of the silicon wafer 2100 to remove some of the material from where the cavities are to be formed and to create openings in which metallic heat extraction structures can be plated. Having anisotropically etched these "slivers" of material out of the silicon wafer 2100, a plating operation can then be formed to fill the small openings 2103 with metallic structures 2104, both in the regions where cavities are to be formed and in the regions where the metallic heat extraction structures 2105 are to remain. The excess metal material can be removed (e.g., by a CMP operation, a grinding operation, a wet etch operation, etc.), and another mask structure 2106 can be disposed over the silicon wafer 2100, with openings exposing the metal material in the regions where the cavities are to be formed, but not exposing the metallic heat extraction structures 2105.

Figure 25:
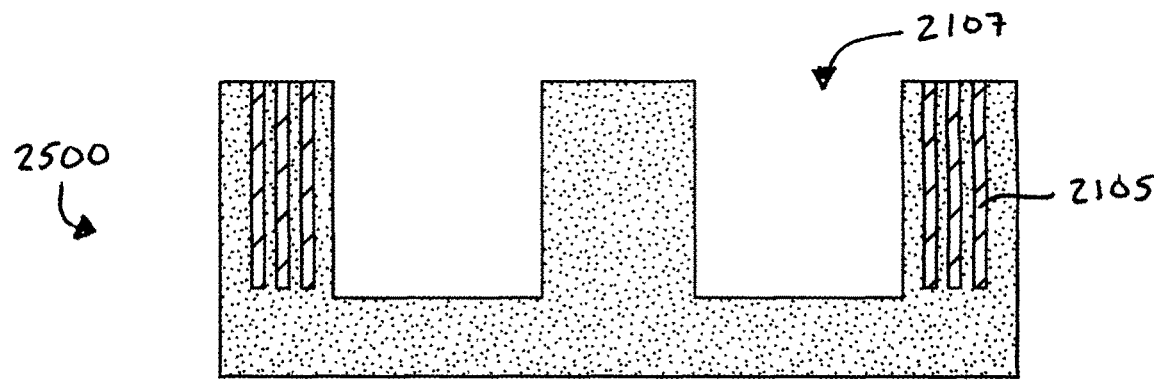
Figure 26:
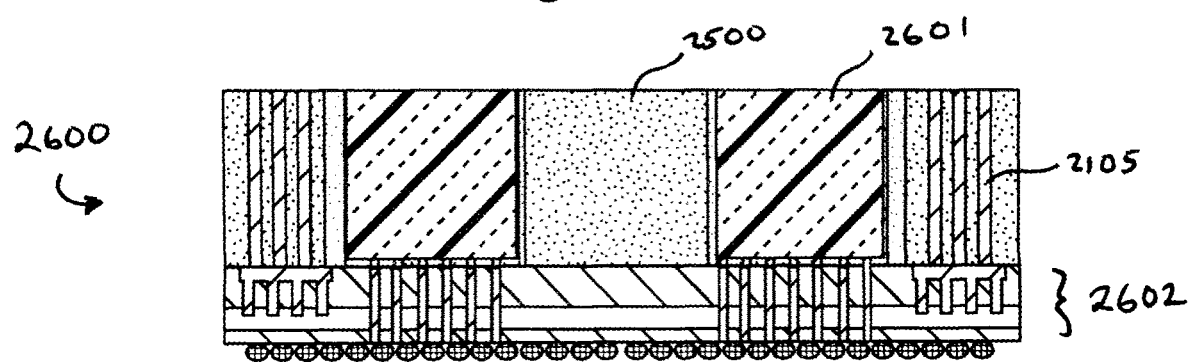
FIG. 26 is a simplified schematic cross-sectional view of a semiconductor device assembly in accordance with one embodiment of the present disclosure.

A subsequent isotropic (e.g., wet) etch operation can be performed to remove the metal structures and the remaining silicon material from the silicon wafer 2100 where the cavities are to be formed. The result of such an operation is illustrated in FIG. 25, which shows cavities 2107 and metallic heat extraction structures 2105 having been formed by this process in accordance with one embodiment of the present disclosure. After removing the remains of mask layer 2106 (e.g., via a chemical and/or mechanical removal process), monolithic silicon structure 2500, with included metallic heat extraction structures 2105 and cavities 2107, is ready for the processes previously described in greater detail above with reference to FIGS. 2 through 10 and/or 15 through 20. In this regard, FIG. 26 illustrates a simplified schematic cross-sectional view of a semiconductor device assembly 2600 in accordance with one embodiment of the present disclosure. Assembly 2600 includes a monolithic silicon structure 2500 in which are disposed metallic heat extraction structures 2105 for extracting heat from a lower semiconductor device 2602 (e.g., through contact with thermal contacts in the lower semiconductor device 2602). The assembly 2600 further includes one or more semiconductor devices 2601 (two are illustrated) in cavities of the monolithic silicon structure, coupled to the lower semiconductor device 2602.

As will be readily understood by those of skill in the art, although the foregoing examples are illustrated with partial cross-sectional views in which a single lower semiconductor device is bonded to a single monolithic structure, embodiments of the present disclosure contemplate wafer-level processing in which an un-singulated wafer comprising a plurality of lower semiconductor devices is bonded to a wafer-level monolithic silicon structure to provide a wafer-level intermediate structure from which individual assemblies can be singulated. Alternatively, in another embodiment, singulated monolithic silicon structures can be individually bonded to an un-singulated wafer comprising a plurality of lower semiconductor devices. In yet another embodiment, singulated monolithic silicon structures can be individually bonded to singulated lower semiconductor devices.

Although in the foregoing example embodiments monolithic silicon structures have been illustrated and described as including thermal pads or metallic heat extraction structures in contact with corresponding thermal contacts on a lower semiconductor device, in other embodiments these features can be omitted and a monolithic silicon structure can be bonded to a surface of a lower semiconductor device without any intermediating metal structures.

Although in the foregoing example embodiments monolithic silicon structures have been illustrated and described as including two cavities of the same depth and plan area with similarly-sized semiconductor devices therein, those of skill in the art will readily appreciate that the number of cavities is not so limited, and monolithic silicon structures in other embodiments may have more or fewer cavities, cavities of different plan areas and/or depths to accommodate semiconductor devices (or other electrical components, including passive circuit components) of different sizes and shapes.

Moreover, although in the foregoing example embodiments monolithic silicon structures have been illustrated and described as disposed over a lower semiconductor die having a same plan area as the monolithic silicon structure, those of skill in the art will readily appreciate that monolithic silicon structures can be employed in other arrangements (e.g., bonded to more than one lower die, bonded to a device substrate, etc.) and need not have a same plan area as the device on which they are carried.

In accordance with one aspect of the present disclosure, the semiconductor device assemblies illustrated and described above could include memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could include logic dies (e.g., controller dies, processor dies, etc.), or a mix of logic and memory dies (e.g., a memory controller die and a memory die controlled thereby).

Figure 27:
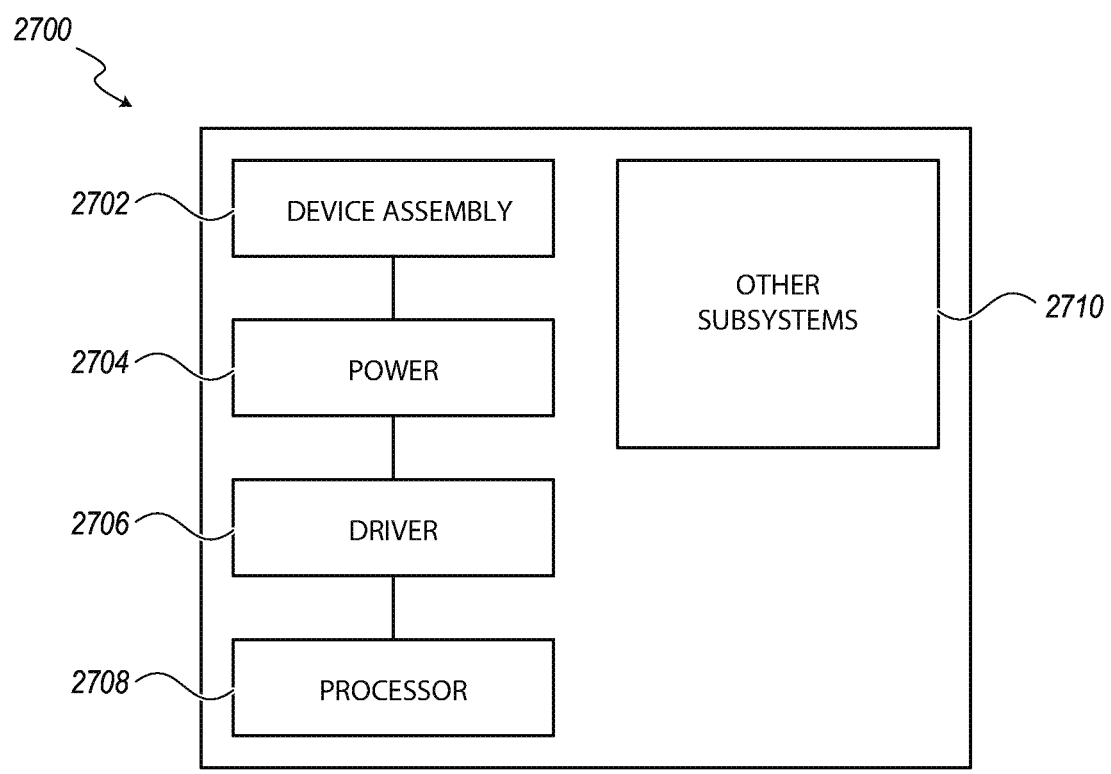
FIG. 27 is a schematic view showing a system that includes a semiconductor device assembly configured in accordance with an embodiment of the present disclosure.

Any one of the semiconductor devices and semiconductor device assemblies described above can be incorporated into any of a myriad of larger and/or more complex systems, a representative example of which is system 2700 shown schematically in FIG. 27. The system 2700 can include a semiconductor device assembly (e.g., or a discrete semiconductor device) 2702, a power source 2704, a driver 2706, a processor 2708, and/or other subsystems or components 2710. The semiconductor device assembly 2702 can include features generally similar to those of the semiconductor devices described above. The resulting system 2700 can perform any of a wide variety of functions, such as memory storage, data processing, and/or other suitable functions. Accordingly, representative systems 2700 can include, without limitation, hand-held devices (e.g., mobile phones, tablets, digital readers, and digital audio players), computers, vehicles, appliances and other products. Components of the system 2700 may be housed in a single unit or distributed over multiple, interconnected units (e.g., through a communications network). The components of the system 2700 can also include remote devices and any of a wide variety of computer readable media.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
a first semiconductor device including a plurality of electrical contacts on an upper surface thereof;
a monolithic silicon structure having a lower surface in contact with the upper surface of the first semiconductor device, the monolithic silicon structure including a cavity extending from the lower surface completely through a body of the monolithic silicon structure to a top surface of the monolithic silicon structure; and
a second semiconductor device disposed in the cavity, the second semiconductor device including a plurality of interconnects, each operatively coupled to a corresponding one of the plurality of electrical contacts.

2. The semiconductor device assembly of claim 1, wherein the monolithic silicon structure has a plan area corresponding in size and shape to a plan area of the first semiconductor device.

3. The semiconductor device assembly of claim 1, wherein the upper surface of the first semiconductor device includes a plurality of thermal contacts in direct contact with the lower surface of the monolithic silicon structure.

4. The semiconductor device assembly of claim 3, wherein the monolithic silicon structure includes a plurality of metallic heat extraction structures in direct contact with the plurality of thermal contacts and extending completely through the body of the monolithic silicon structure.

5. The semiconductor device assembly of claim 4, wherein each of the plurality of metallic heat extraction structures comprises a column or fin of a metal material.

6. The semiconductor device assembly of claim 1, wherein the lower surface of the monolithic silicon structure is bonded to the upper surface of the first semiconductor device by a dielectric bond.

7. The semiconductor device assembly of claim 1, wherein the plurality of interconnects is a first plurality of interconnects, the cavity is a first cavity, the monolithic structure includes a second cavity extending from the lower surface completely through the body of the monolithic silicon structure to the top surface of the monolithic silicon structure, and further comprising a third semiconductor device disposed in the second cavity and including a second plurality of interconnects, each operatively coupled to a corresponding one of the plurality of electrical contacts.

8. The semiconductor device assembly of claim 1, wherein the second semiconductor device includes a vertical stack of electrically coupled memory devices.

9. The semiconductor device assembly of claim 1, wherein one or more of the upper surface of the first semiconductor device and the lower surface of the monolithic silicon structure include a redistribution layer.

10. A semiconductor device assembly, comprising:
a first semiconductor device including an upper surface;
a monolithic silicon structure having a lower surface in contact with the upper surface of the first semiconductor device, the monolithic silicon structure including a cavity extending from the lower surface completely through a body of the monolithic silicon structure to a top surface of the monolithic silicon structure; and
a second semiconductor device directly coupled to the first semiconductor device and disposed in the cavity such that a back surface of the second semiconductor device is generally coplanar with the top surface of the monolithic silicon structure.

11. The semiconductor device assembly of claim 10, wherein the monolithic silicon structure includes a plurality of metallic heat extraction structures laterally spaced apart from the cavity and extending completely through the body of the monolithic silicon structure.

12. The semiconductor device assembly of claim 11, wherein each of the plurality of metallic heat extraction structures comprises a column or fin of a metal material.

13. The semiconductor device assembly of claim 11, wherein each of the plurality of metallic heat extraction structures has an exposed upper surface that is generally coplanar with the top surface of the monolithic silicon structure.

14. The semiconductor device assembly of claim 10, further comprising a third semiconductor device disposed on and electrically coupled to the back surface of the second semiconductor device.

15. The semiconductor device assembly of claim 14, wherein the third semiconductor device is encapsulated by a mold material.

16. The semiconductor device assembly of claim 15, wherein the third semiconductor device is disposed in a second cavity of a second monolithic silicon structure disposed over the first monolithic silicon structure.

17. A semiconductor device assembly, comprising:
a first semiconductor device including an upper surface;
a second semiconductor device directly carried by an upper surface of the first semiconductor device; and
a monolithic silicon structure having a lower surface in contact with the upper surface of the first semiconductor device, the monolithic silicon structure including a cavity extending from the lower surface completely through a body of the monolithic silicon structure to a top surface of the monolithic silicon structure,
wherein the monolithic silicon structure completely surrounds a plurality of sidewalls of the second semiconductor device.

18. The semiconductor device assembly of claim 17, wherein the monolithic silicon structure includes a plurality of metallic heat extraction structures laterally spaced apart from the cavity and extending completely through the body of the monolithic silicon structure.

19. The semiconductor device assembly of claim 18, wherein each of the plurality of metallic heat extraction structures comprises a column or fin of a metal material.

20. The semiconductor device assembly of claim 18, wherein each of the plurality of metallic heat extraction structures has an exposed upper surface that is generally coplanar with the top surface of the monolithic silicon structure.

* * * * *